United States Patent [19]
Filsinger et al.

[11] Patent Number: 4,914,550
[45] Date of Patent: Apr. 3, 1990

[54] DEVICE FOR THE ARRANGING OF AN ELECTRONIC COMPONENT, PARTICULARLY A MODULE HAVING CIRCUIT BOARDS

[75] Inventors: Reinhard Filsinger, Plochingen; Arnold Mann, Biebergemünd; Volker Sellner, Weilrod, all of Fed. Rep. of Germany

[73] Assignee: VDO Adolf Schindling AG, Frankfurt am Main, Fed. Rep. of Germany

[21] Appl. No.: 177,560

[22] Filed: Apr. 4, 1988

[30] Foreign Application Priority Data

Apr. 3, 1987 [DE] Fed. Rep. of Germany ....... 3711341

[51] Int. Cl.⁴ .............................................. H05K 7/20
[52] U.S. Cl. .................................. 361/386; 361/391; 361/393; 361/395; 361/399; 361/415
[58] Field of Search .................. 211/41; 361/413, 415, 361/386-389, 391, 394-395, 399; 439/153, 157

[56] References Cited
U.S. PATENT DOCUMENTS 3,784,954  1/1974  Grimm et al. .................... 361/391
4,236,190 11/1980  Hollingsead et al. ............. 361/391
4,313,150  1/1982  Chu ..................................... 439/153
4,506,439  3/1985  Roake ................................. 361/395
4,648,009  3/1987  Beun et al. ......................... 361/395
4,738,632  4/1988  Schmidt et al. .................... 361/393

FOREIGN PATENT DOCUMENTS 0135437  5/1979  Fed. Rep. of Germany ...... 361/415
0361537  2/1973  U.S.S.R. ............................. 361/415

Primary Examiner—Gregory Thompson
Attorney, Agent, or Firm—Martin A. Farber

[57] ABSTRACT

A fastening device can be rapidly handled without tools for securing a module of electronic components within a housing. The device brings the module into thermally conductive contact with the housing to assure heat transfer for cooling the module. For this purpose there is proposed a hook-shaped lever which is pivoted on the module and is suspended on the housing. During a swinging movement, the lever moves the module initially parallel to a contact surface and thereupon towards it. The module is additionally supported on an outer support in the housing.

10 Claims, 5 Drawing Sheets

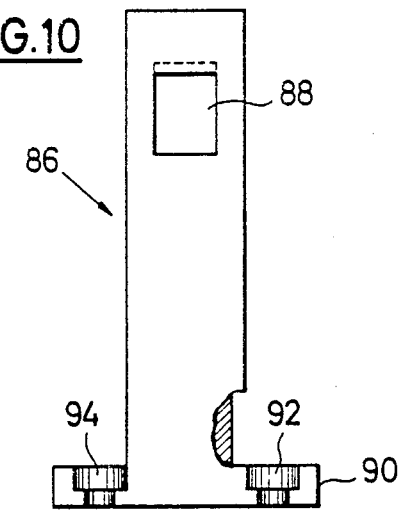
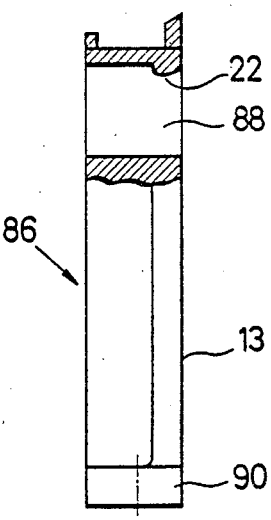
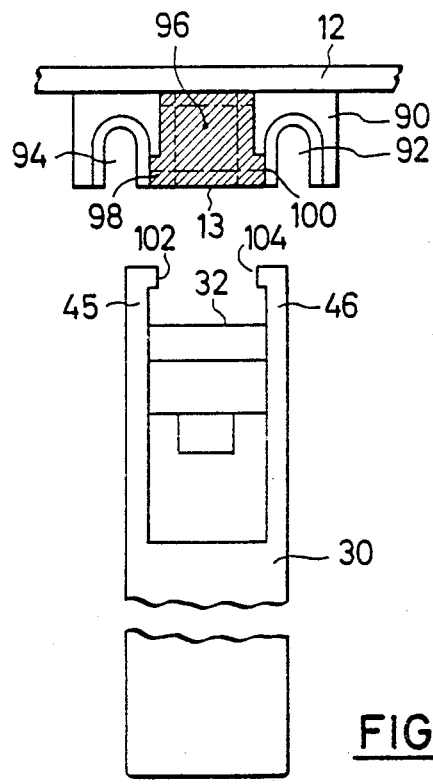

DEVICE FOR THE ARRANGING OF AN ELECTRONIC COMPONENT, PARTICULARLY A MODULE HAVING CIRCUIT BOARDS

FIELD AND BACKGROUND OF THE INVENTION

The present invention relates to a device for the placement of an electric component, particularly a module having circuit boards, within a housing, one wall of the module resting for purposes of cooling, at least at individual sections, against a contact surface of the housing and electrical contacts of the module being connected to mating contacts arranged in the housing.

Electronic components are being increasingly used in automotive engineering for purposes of monitoring, control and regulating. They are arranged preferably in compact modules which are relatively easy to replace. The arrangement of several modules in one housing, with the electric connections being produced by contacts arranged on the end of the modules together with mating contacts in the housing has proven particularly suitable. The heat is removed primarily from the module to the housing by physical contact. The required mechanical contact is produced by screw or clamp connections, the force being exerted in the direction perpendicular to the contact surface while the direction of movement upon the connecting of the electric contacts is preferably parallel to the surface of contact. Installation and removal of a module for test or repair purposes are therefore time-consuming and require the use of a tool.

The object of the present invention is to create a device for the fastening within a housing of a module which can be handled rapidly without the use of tools and detachably connects electrically and mechanically to the housing in such a manner that a dependable transfer of heat is assured.

SUMMARY OF THE INVENTION

This object is achieved in accordance with the invention by providing the device with a lever element which is swingable around or towards a pin which is fixed in position in the module and extends parallel to the contact surface, The lever element is developed with two arms, one arm of the lever element being developed as a connecting arm which interacts with a holding device arranged on the housing, that the other arm of the lever element being developed as a handle. The module can be tilted in the direction towards a contact surface around an outer support which is arranged at a distance from a pin.

Upon insertion into the housing, the module is introduced approximately parallel to the contact surface until it grips the outer support which is preferably arranged in the dvicinity of electrical contacts. The outer support serves as fulcrum for a tilting movement directed towards the contact surface, which movement is produced by a lever element which is arranged as far as possible from the outer support. By swinging the double-armed lever element, connection to the housing is produced by one arm of the lever element which is developed as a connecting arm. In this way, one sidewall of the module is pressed firmly against the contact surface on the inner side of the housing at one end by the outer support, and at the other end is secured by the connecting element, and produces a mechanical contact which makes the removal of the heat possible. The second arm of the lever element is developed as a handle grip so that the actuating of the lever element can be effected without the use of any tool.

The connecting arm is preferably developed in hook shape, the opening of the hook pointing in a direction leading away from the outer support. Accordingly, the level element can be arranged on the front side of the module and, upon the swinging out of the handle, the hook is moved back below the plane of the contact surface.

Upon the fastening of the module in the housing, the hook is again swung out by the pushing back of the handle. This has been found advantageous for the holding device, which is arranged in the housing wall, to be developed as a projection which is gripped around in the rear by the hook. This can take place, for instance, by providing the sidewall of the housing with a chamber that can completely receive the hook. The wall of the chamber which is associated with the tip of the hook has at its edge a projection, such as a bead, which points towards the chamber.

As soon as the point of the hook has come behind the projection in the sidewall of the housing, the module can be pressed firmly against the contact surface of the housing wall. This is advantageously effected in the manner that the lever element has a guide, such as a slot, which is displaceable at a right angle to the pin and the end points of which are spaced by different distances from the region of contact of the connecting arm with the holding element, the end point assumed by the pin in the fastening end position of the lever element having the smaller spacing.

For example, the slot can extend spirally to the center point of the tip of the hook or else be in the shape of a circular arc, the center of the circle lying laterally of the center point of the tip of the hook. The arcuate or spiral development of the slot guide procedures a gradually increasing action of force on the hook upon the swinging of the hook element. It is clear that by a nonspiral development of the slot a different course of the force can also be produced. Thus it is possible to produce a particularly high final force by an embodiment which is flatter towards the end.

If the pin of the lever element is arranged transverse to the direction of the force which is to be applied upon the fitting together of the electrical contacts, then the considerable force required in the case of a large number of contacts can be reduced considerably by a special development of the lever element. For this purpose electrical contacts which are developed, for instance, as jacks and plugs are arranged preferably on the wall of the housing of the module which lies perpendicular to the contact surface so that the direction of plugging movement is parallel to the contact surface.

The force required upon the fitting together of the electrical contacts can be reduced by use of the lever element as a single-arm lever supported on the holding device of the housing and which, upon a pressing of the handle against the module in the vicinity of the holding device, can act on the module and displace it.

The lever element therefore preferably has a limiting element which acts in the direction of displacement and which interacts, at least in a partial region of the motion of swing, with a guide surface which is associated with the pin. In this way the result is obtained that, during the insertion of the module into the housing, upon the swinging back of the level element the connecting arm rests in the housing wall and thus forms at this end a fulcrum for the lever element.

By the limiting element, for instance a collar-shaped projection on the rear of the lever element, the latter now rests on a guide surface and thus, in accordance with the principle of the single-arm lever, makes it possible to exert a particularly strong force in the direction towards the plug contacts. The guide surface terminates corresponding to the end position of the plug connection so that the collar-shaped limiting element can no longer exert any force.

Upon the further swinging of the lever element, the slotlike guide now slides along the pin and induces a movement of the module towards the housing wall perpendicular to the previous direction. This course of movement can be referred to as L-shaped since, initially, the swing of the lever element produces a long straight movement of the module parallel to its contact surface and, at the end, it produces a short movement, accompanied by a high action of force, perpendicular to the contact surface.

If the lever element has a spring element which swings the lever element bistability into the fastening and the releasing end positions respectively, then a vibration-proof fastening is possible thereby, particularly upon the installing of modules into an automobile. The spring element can be developed, for instance, as a compression spring which is arranged within the lever element and rests, on the one side, on the pin and, on the other side, on an outer support which is arranged in the vicinity of the operating handle.

The lever element can be developed with a double wall in this region in order to receive the spring element, so that the spring element can be installed symmetrically in the center.

The pin of the lever element is advantageously contained directly in the side walls of the module. Upon vertical arrangement of the side walls there is thereby automatically obtained a position of the pin parallel to the contact surface and transverse with respect to the direction towards the outer support. With this arrangement, the guide surface on which the limiting element of the lever element slides can, at the same time, be a part of the anterior of the module.

In another proven embodiment of the fastening device, the latter is not connected directly to the module but the pin is contained in two support elements which surround the module parallel to the contact surface and are tiltably connected to the module between the outer support and the pin. In this embodiment, an intermediate frame having supporting elements is fastened in the housing and the module is pivotally mounted in the center of this intermediate frame. In this way the holding force is transmitted to the module centrally with respect to the contact surface so that small deviations are compensated for. If the intermediate frame is developed with a certain initial tension, an elastic application of the module against the sidewall of the housing can be obtained.

In one particularly suitable embodiment of the device mount to which the module can be connected is arranged on the sidewll of the housing. The mount is detachably fastened in the housing and has a T-shaped cross section, first guide elements being arranged on the side of the mount facing the module. The longitudinal side of the module lies against the mount, which has both the contact surface for the module and holding device for the hook element of the module. Parallel to the longitudinal side of the module there are arranged two guide elements which are preferably tong-shaped so that they can engage behind the first guide elements of the T-shaped mount. It is advisable to continue the sidewalls of the module out beyond the longitudinal side and to bend them off inwards at the edges or provide them with beads so that these form the second guide elements.

BRIEF DESCRIPTION OF THE DRAWINGS

With the above and other objects and advantages in view, the present invention will become more clearly understood in connection with the detailed description of preferred embodiments, when considered with the accompanying drawings, of which:

FIG. 10 is a front view, partially in section, of the holder of FIG. 9, FIG. 11 is a longitudinal section through the holder, FIG. 12 is an end view of the holder, and FIG. 13 is a cross section through a module.

DETAILED DESCRIPTION OF THE PREFERRED EMBODIMENTS

Figure 1:
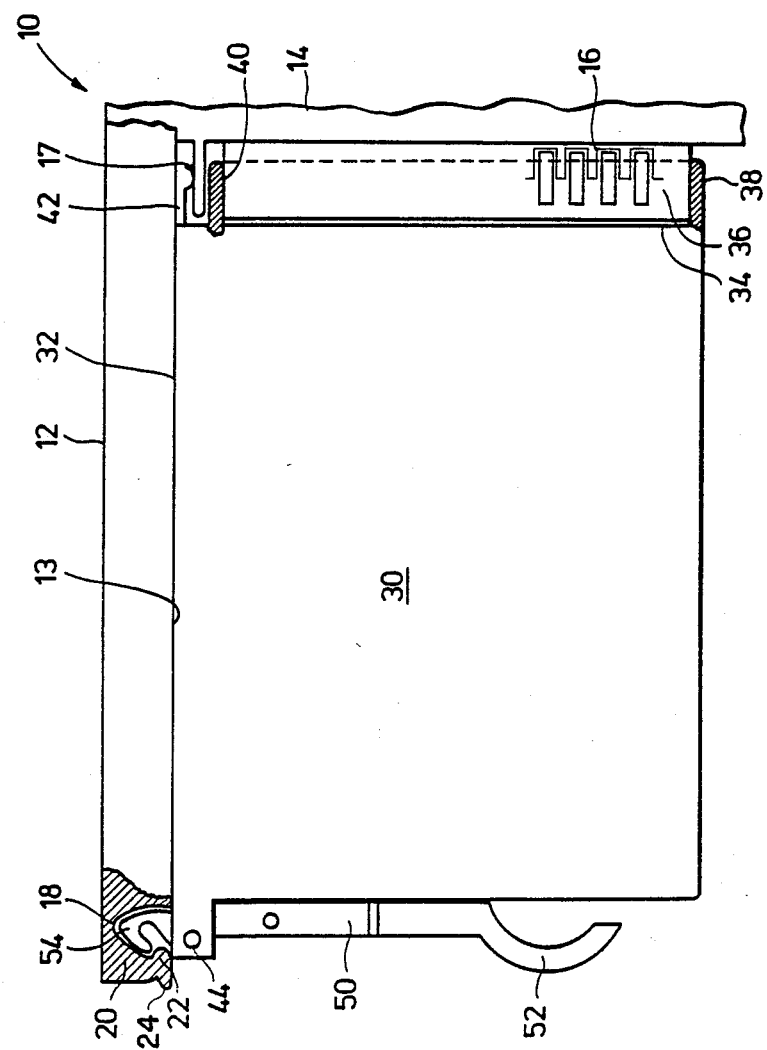
FIG. 1 is a longitudinal section through a housing with module inserted.

FIG. 1 shows, in longitudinal section, a housing 10 having a sidewall 12 and a rear wall 14. Electric mating contacts 16 are arranged in a plug element on the rear wall 14. Parallel to the side wall 12, the rear wall 14 has a projection 17. The side wall 12 of the housing 10 has, on its inner side, a contact surface 13 and, at its front end, a chamber 18 which can receive a hook 54 which is attached to the module 30.

The chamber 18 is bounded in front by a front wall 20 which extends from the side wall 12 and terminates in an outwardly protruding bead-like projection 24 and an inwardly protruding bead-like projection 22. The projection 22 serves as a stop for the hook 54.

The module 30, which has electric or electronic components within it, has its longitudinal side 32 resting against the contact surface 13 of the housing 10. At the end side 34 of the module 30 there are electric contacts 36 which can be connected to the corresponding electric mating contacts 16 in the housing. To the side of the electric contacts 36 there are arranged guide elements 38 and 40 respectively. A spring element 42, also arranged at the end side, slides on the projection 17 of the housing 10 and, together with the guide elements 38 and 40 respectively, guides the module 30 upon the insertion into the housing 10.

Figure 2:
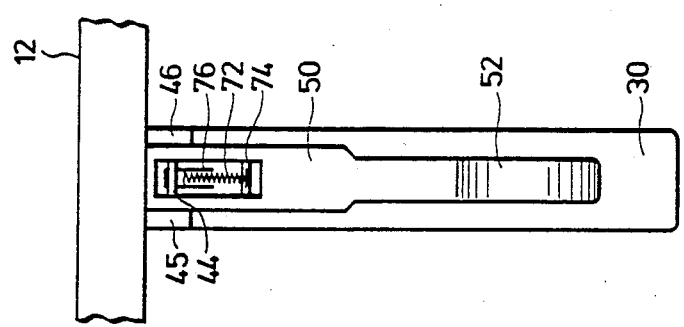
FIG. 2 is a front view of a module inserted in a housing.

On its front side, the module has a locking lever 50 developed as a double-armed lever, which is swingable around a pin 44. The pin 44 is held in the sidewalls 45 and 46 of the module 30, which walls can be noted from FIG. 2. The double-armed lever 50 has a handle 52 at one end and a hook 54 at the other end. In the region of the pin 44 the locking lever 50 is developed with double walls, a compression spring 72 attached to a bolt 74 being arranged within it, the spring being swingable in a spring guide 76 around the pin 44.

Figure 4:
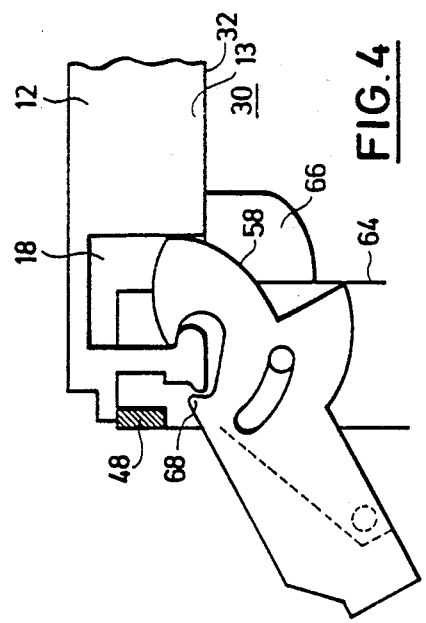
FIG. 4 is a detailed view of the locking device, in an intermediate phase.
Figure 6:
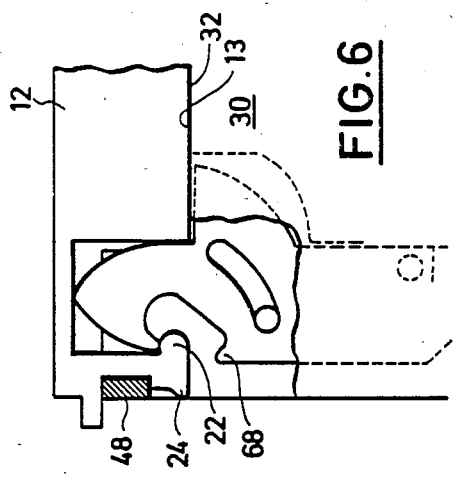
FIG. 6 is a detailed view of the locking device in the locked condition.
Figure 3:
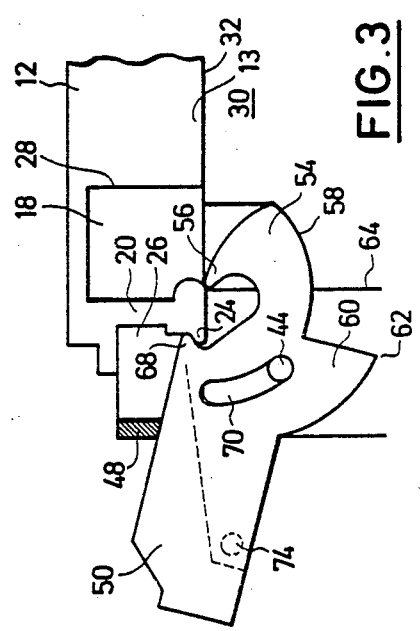
FIG. 3 is a detail view of the locking device of the module on the housing, in released condition.
Figure 5:
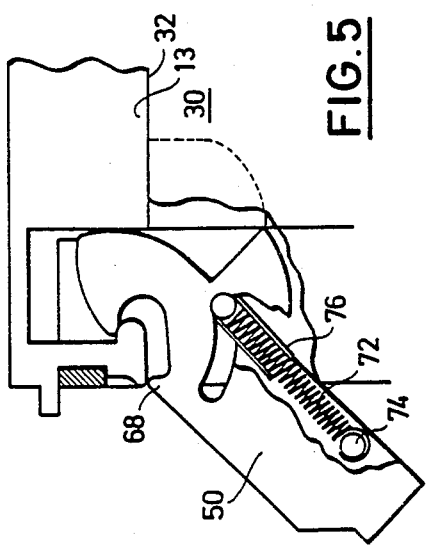
FIG. 5 is a detailed view of the locking device in a later intermediate phase, in a partially broken-away showing.

FIGS. 3 to 6 show the course in time of the locking process from the released state shown in FIG. 3 through two intermediate states in FIGS. 4 and 5 into the locked condition in FIG. 6. By the interaction of the specially developed locking lever 50 with corresponding mating surfaces on housing 10 and module 30 there is obtained a course of movement which at the start of the locking process moves the module 30 parallel to the contact surface 13 and later on perpendicular to it. By this course of movement the electrical contacts 36 at the end side 34 of the module 30 are first of all inserted into the mating contacts 16 present on the housing rear will 14 and the module 30 is then pressed with high force by means of its longitudinal side 32 against the contact surface 13 and locked in this position.

On the front side of the module 30, adjacent to the longitudinal side 32 there is located the locking lever 50 which is swingable around the pin 44 which is recessed in the sidewalls 45, 46. In released condition, shown in FIG. 3, the longitudinal pin of the lever 50 is inclined obliquely to the housing sidewall 12 and upon the insertion of the module 30 into the housing 10 the stop 68 of the lever 50 strikes against a beadlike projection 24 on the front end of the housing sidewall 12 which terminates with the wall 20. If the locking lever 50 is now turned in counterclockwise direction, by the action of force on the end 52 developed in the manner of a grip, into the position shown in FIG. 4 then the tip 56 of the hook 54 moves in the direction towards the housing sidewall 12 and the tip 56 of the hook can enter into the chamber 18 and grip behind the beadlike projection 22 of the front wall 20. At the same time, the rear side 58 of the hook 54 contacts the rear side 28 of the chamber 18 and slides along the rear side 28 into the chamber 18.

FIG. 4 shows the position in which the tip 62 of a bracket 60 which is arranged laterally on the hook 50 contacts a slide surface 64 on the front side of the module 30. Upon further rotation of the lever 50 in counterclockwise direction, the tip 56 of the hook now rests on the inside of the front wall 20 against the projection 22 and the point 62 of the bracket rests on the slide surface 64. In this connection there takes place a linear movement of the module 30 parallel to the contact surface 13 of the housing 10. In this connection a fitting piece 48 which is also arranged between the sidewalls 45, 46 of the module 30 is pushed into a recess 26 in the front wall 20 of the chamber 18. The linear movement terminates as soon as the position shown in FIG. 5 is reached.

The bracket tip 62 now reaches the end of the slide surface 64 and the bracket tip 62 can swing into a recess 66 in the module 30. Therefore the center point of the hook tip 56 remains the fulcrum of the locking lever 50, the latter sliding by means of a guide formed therein as a slot 70 of arcuate shape along the pin 44. This arcuate-shaped slot 70 is not precisely concentric to the center point of the tip 56 of the hook, but rather the center point of the arcuate slot 70 lies to the side of the center point of the hook tip 56, as a result of which a wedge action takes place, in the sense that the distance between the slot 70 and the hook tip 56 decreases slightly so that the pin 44 is moved at low speed and high force gradually in the direction towards the contact surface 13 of the housing 10 until the end position shown in FIG. 6 is reached. Accordingly, the longitudinal side 32 of the module 30 rests firmly against the sidewall 12 of the housing 10, namely against the front end as a result of the course of movement just described and against the rear end as a result of the force of the spring element 42.

In the end position, the compression spring 72 acts within the region of the locking lever 50 which is developed with a double wall in such a manner that the locking lever 50 is pressed against the front side of the module 30 and is thus secured against vibration. In the other end position, shown in FIG. 3, the compression spring 72 also assumes a stable end condition, it swinging the lever 50 outward until the end of the slot 70 lies against the pin 44 and, at the same time, the rear 58 of the hook 54 lies against the recess 66 of the module 30.

Figure 8:
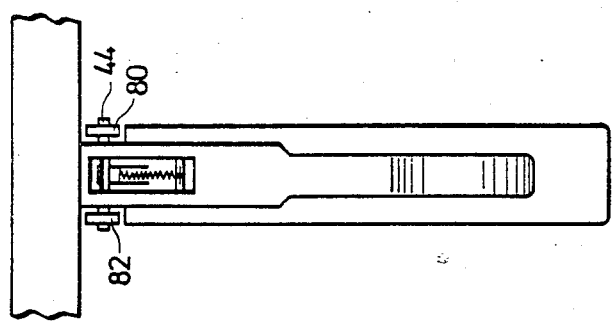
FIG. 8 is a front view of the inserted module of FIG. 7.
Figure 7:
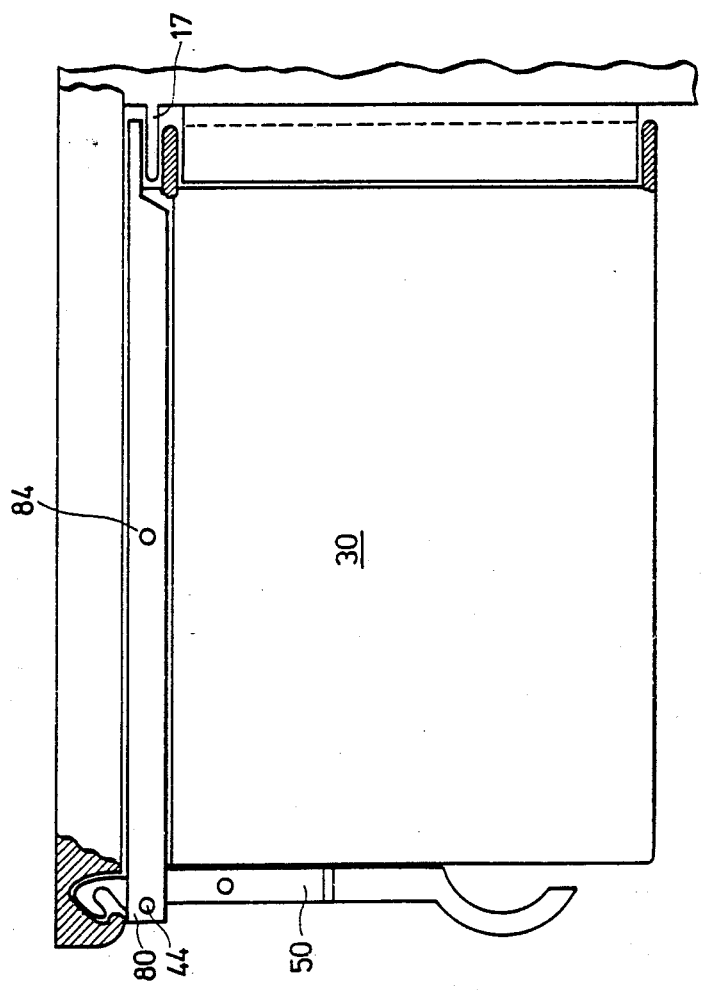
FIG. 7 is a longitudinal section through a housing with module inserted, shown in a preferred embodiment.
Figure 9:
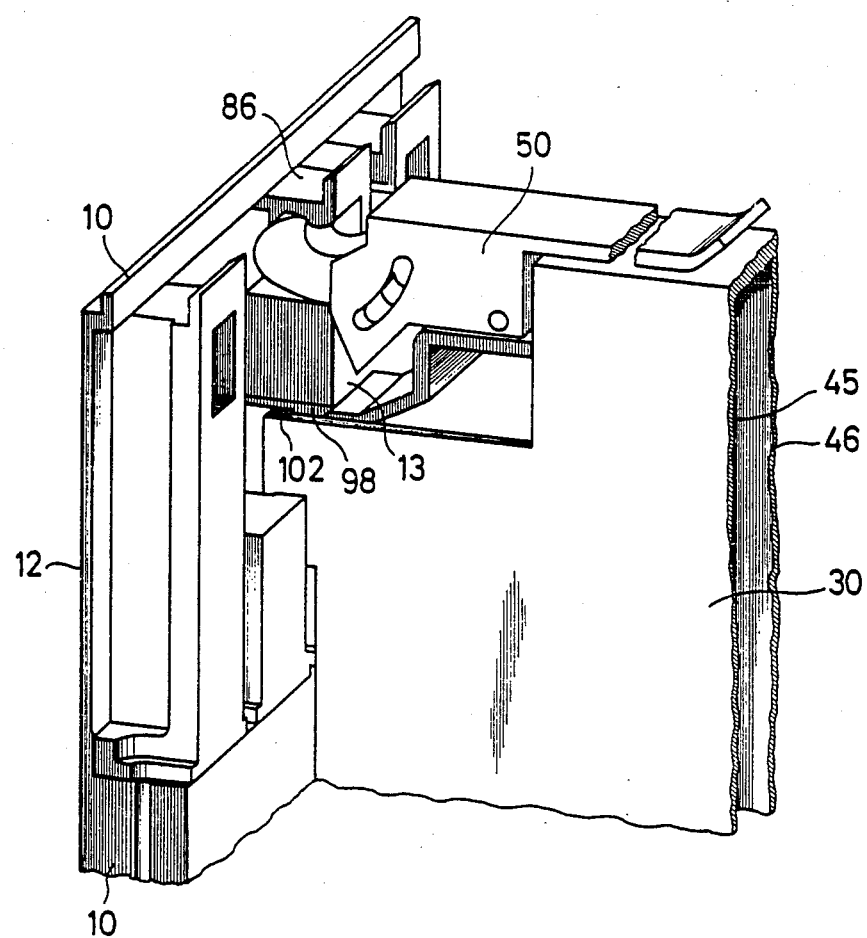
FIG. 9 is a perspective view, partially in section, of another recommended embodiment with a holder.

One particularly advantageous embodiment of the device in accordance with the invention is shown in FIGS. 7 and 8. In this embodiment, the pin 44 is not supported directly in the sidewalls 45, 46 of the module 30 but the pin 44 is rather supported in support levers 80, 82 which are guided in their entire length along the sidewalls 45, 46 of the module 30, parallel to the longitudinal side 32 of the latter. In the region of the end side 34 of the module 30, the support levers 80, 82 are narrowed so that they can be introduced into the space between projection 17 and contact surface 13 of the housing 10. Thus, by actuation of the locking lever 50 the support levers 80, 82 are connected to the housing 10. In the center of the support levers 80, 82, transverse to them, there is arranged a support bolt 84 which passes through the sidewalls 45, 46 of the module 30 and thus connects the module 30 in tiltable manner to the support levers 80, 82. In this way, the entire holding force is transmitted centrally to the longitudinal side 32 of the module 30 so that, even in the case of minor mechanical deviations, the longitudinal side 32 of the module 30 always rests against the contact surface.

A spring action is obtained in the manner that the support levers 80, 82 in the condition of rest are arched towards the contact surface 13, so that they exert a spring force in the locked condition. In the region of the support levers 80, 82, the sidewalls 45, 46 of the module 30 have recesses so that, despite additional support levers 80, 82, the width of the module 30 is not exceeded.

One very suitable embodiment of the device of the invention is shown in FIGS. 9 to 13. Here the same reference numbers as in FIGS. 1 to 8 have been used for the same parts. The special embodiment can be noted particularly clearly from the perspective showing of FIG. 9. It is essential that between the housing 10 and the module 30 there be arranged a mount 86, referred to as holder. The holder 86, which is detachably connected to the housing 10, has a cross section which will be referred to as T-shaped, a web 96 which extends in the longitudinal direction of the holder 86, resting on one longitudinal side against the housing sidewall 12. The opposite longitudinal side of the web 96 is developed as contact surface 13 against which the longitudinal side 32 of the module 30 is pressed. The contact surface 13 protrudes laterally on both sides over the web 96 of the holder 86, first guide elements being developed in the form of rectangular ledgelike projections 98 and 100 along the web 96 adjacent to the contact surface 13. The width of the contact surface 13 is equal to the inside spacing between the sidewalls 45 and 46 of the module 30.

The sidewalls 45 and 46 protrude beyond the longitudinal side 32 of the module 30 by an amount which is somewhat less than the height of the web 96. On the edges of the sidewalls 45 and 46, parallel to the longitudinal side 32, guide rails 102 and 104 which point towards each other are arranged as second guide elements. The distance of the guide rails 102 and 104 from the longitudinal side 32 corresponds to the height of the projections 98 and 100.

In this way, the module 30 is guided in both longitudinal and transverse direction by the holder 86 upon insertion into the housing 10. On its end facing the front side of the housing 10, the holder 86 is provided with a recess 88 which corresponds to the above-described chamber 18 of the housing and has the projection 22 for the locking lever 50. On its end side facing the rear wall of the housing 10, the holder 86 is provided with an angle piece 90 which has recesses 92 and 94. Screws by which the holder 86 is fastened in the housing 10 are passed through the recesses 92 and 94.

We claim:

1. Apparatus for securing an electronic component, particularly a module in a housing, and wherein
   a side wall of the module lies for purposes of cooling against a contact surface of the housing, there being an end wall of said module perpendicular to said side wall, there being electrical contacts in the end wall of the module connectable to mating contacts located in an abutting surface of the housing; the apparatus comprising
   a pivot pin fixed to the module and oriented parallel to the contact surface;
   a holding device disposed on the housing;
   an outer support disposed on said housing at a distance from said pin;
   a lever element, which is pivotable about said pin, said pin serving as a first point of pivoting during a securing of said electronic component, the lever element having two arms of which one arm serves as a connecting arm for interaction with said holding device, the other arm of said lever element serving as a handle, said holding device serving as a second point of pivoting by which said lever element is pivoted during the securing of said electronic component; and wherein
   said lever element comprises a guide which contacts said pin and is displaceable relative to said pin, displacement of said guide about said pin shifting a point of pivot of said lever element, said guide having a first end point and a second end point opposite said first end point, said first and said second end points being spaced apart from said holding device, said first end point engaging with said pin at said first pivot in a fastening-in position of the lever element;
   the module is tiltable about said outer support in a direction towards the contact surface; and
   a point of pivoting of said lever element shifts from said first to said second point of pivoting upon interaction of said connecting arm with said holding device.

2. Apparatus according to claim 1, wherein
   a portion of said connecting arm is formed in hook shape with an opening facing away from said outer support.

3. Apparatus according to claim 2, wherein
   said holding device comprises a projection positioned for engagement with said connecting arm.

4. Apparatus according to claim 1, wherein
   said guide is formed as an elongated slot.

5. Apparatus according to claim 4, wherein
   said pin extends transversely to the direction of a force to be applied upon a joining together of the electrical contacts and the mating contacts.

6. Apparatus according to claim 5, wherein
   said lever element has an abutment which, in the direction of displacement, interacts at least in a partial region of the swinging movement with a slide surface to limit pivoting about said pin.

7. Apparatus according to claim 4, wherein
   said lever element has an abutment which, in the direction of displacement, interacts at least in a partial region of the swinging movement with a slide surface to limit pivoting about said pin.

8. Apparatus according to claim 1, wherein
   said lever element has a spring connecting with said pin for swinging the lever element bistability into fastening and releasing end-positions, alternately.

9. Apparatus according to claim 1, wherein
   said pin is fastened into sidewalls of the module.

10. Apparatus according to claim 1, further comprising
    a second pin; and
    two support elements disposed parallel to said contact surface of the module and being tiltably connected to said module between said outer support and said pivot pin by said second pin; and wherein
    said pivot pin is secured to said two support elements.

* * * * *